(12) United States Patent
Setlur et al.

(10) Patent No.: US 6,438,181 B1
(45) Date of Patent: Aug. 20, 2002

(54) EFFICIENT METRIC MEMORY CONFIGURATION FOR A VITERBI DECODER

(75) Inventors: Jyoti Setlur, Irvine; Howard Tran, Downey, both of CA (US)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/321,682

(22) Filed: May 28, 1999

(51) Int. Cl.[7] ............................................... H04L 27/06
(52) U.S. Cl. ....................... 375/341; 375/262; 714/795; 704/242; 370/342
(58) Field of Search ................................ 375/262, 341; 714/795; 704/242; 370/342

(56) References Cited

U.S. PATENT DOCUMENTS 5,910,186 A * 6/1999 Dent et al. .................. 714/786
6,009,127 A * 12/1999 Piirainen ..................... 375/341
6,163,581 A * 12/2000 Kang .......................... 375/341
6,351,839 B1 * 2/2002 Lee et al. .................... 714/795

* cited by examiner

Primary Examiner—William Trost
Assistant Examiner—Danh C Le
(74) Attorney, Agent, or Firm—Peter Zawilski

(57) ABSTRACT

An apparatus and method thereof for storing and retrieving information in a Viterbi decoder. The apparatus includes a bus and a branch metric generator unit coupled to the bus. The branch metric generator unit generates metrics by measuring a difference between an encoded data bit and an expected data bit calculated using a convolutional code. A memory unit is also coupled to the bus. The memory unit includes a first register and a second register for storing the metrics. A parity bit is used to indicate a register for storing the metrics. In a first stage of the Viterbi decoder, a metric for a first state is stored at a first address in the first register and a metric for a second state is stored at a second address in the second register. The first state and the second state each branch to a third state and a fourth state in a trellis code of the Viterbi decoder.

20 Claims, 10 Drawing Sheets

EFFICIENT METRIC MEMORY CONFIGURATION FOR A VITERBI DECODER

TECHNICAL FIELD

The present invention pertains to the field of wireless communication technology. More specifically, the present invention pertains to decoding signals received by a receiver in a wireless communication system.

BACKGROUND ART

Wireless telephony has become a widely available mode of communication in modem society. Variable rate communication systems, such as Code Division Multiple Access (CDMA) spread spectrum systems, are among the most commonly deployed wireless technology. Variable rate communication systems transmit data in units called data frames.

CDMA utilizes digital encoding for every telephone call or data transmission in order to provide privacy and security. Unique codes are assigned to every communication, which distinguish it from the multitude of calls simultaneously transmitted over the same broadcast spectrum. Users share time and frequency allocations and are channelized by unique assigned codes. The signals are separated at the receiver in a known manner so that the receiver accepts only signals from the desired channel.

Some CDMA spread spectrum systems use a form of direct sequence in which, in essence, a communication waveform is modified by a pseudonoise binary sequence in the transmitter. A second modification by a replica of the pseudonoise binary sequence occurs in the receiver to recover the original signal. Generally, within a CDMA environment with a large number of users on the system, a high level of channel noise is usually present. In particular, each user is a source of noise to every other user on the same system. Undesired signals also contribute to the noise. Noise and interference, being uncorrelated with the pseudonoise binary sequence, add an element to the signal that needs to be considered when recovering the original signal.

Convolutional codes are known in the art and are used by the transmitter to encode a stream of binary digits. Typically, a convolutional encoder consists of a N-stage shift register and modulo-2 adders. Each digit of the digit stream is input into the shift register, and the convolutional code generates output digits that are an encoded version of the each input digit. For example, if the coding rate is ½, two output digits are generated for each input digit. A convolutional code is often represented in a known fashion using a trellis that shows the coded output for any possible sequence of input digits.

At the receiver, various techniques are known in the art for decoding a digital stream encoded using convolutional codes. The coding polynomial used in the convolutional code utilized by the transmitter is specified for the receiver, and so the receiver is able to decode the transmitted signal to determine expected values. However, due to the introduction of noise and interference during transmission, the received signal is likely to be different from the transmitted signal. A Viterbi decoder provides a well-known method to correct for errors introduced by noise and interference to determine decoded values based on the received signal. In essence, a Viterbi decoder determines the path through the convolutional code trellis that results in the sequence of digits that agrees most with the received sequence.

Viterbi decoders, their function and implementation are well-known in the art. Expected values for each data frame are determined using the same convolutional code used by the transmitter. The Viterbi decoder computes a metric (such as a Hamming distance or the like) for each branch that feeds into a node ("state") in the convolutional code trellis. The metrics are computed by comparing the received signal and the expected values. The metric for each state is stored in a random access memory unit (e.g., a metric memory).

The metrics for each state are accumulated for each stage of the Viterbi decoder process by adding the state metrics of the corresponding state in the previous stage to the corresponding branch metric (a stage is one cycle through all the states). Due to the nature of the Viterbi decoder trellis and the necessity for metrics from the preceding stage to compute new state metrics, the metric memory cannot be overwritten during the Viterbi decoder process until all state metrics are evaluated for a stage.

One prior art implementation of a metric memory involves using two memory arrays, each array having the same number of locations as there are number of states. One of the arrays is used to store state metrics for the originating stage, and the other array is used to store the metrics for the next stage as they are being calculated. After all of the new state metrics are calculated for a stage, the values in the second array are then copied to the first array before the process is repeated for the next stage. However, this prior art approach is problematic because it requires two full-size arrays, occupying valuable physical space inside the receiver. In addition, this arrangement results in a large number of read and write transactions in order to copy the values from one array to the other. Thus, this approach also consumes processing power, and so larger, more complex and consequently more expensive processors are required if an acceptable performance level is to be maintained. Also, this approach consumes battery power, and so larger and heavier batteries are needed to avoid frequent charging. Consumer preferences are for receivers to be as small, light and inexpensive as possible, and the need for large memory spaces is contrary to these preferences.

Another prior art approach that reduces the number of read and write transactions uses two "ping-pong" memories that work in tandem. For one stage, the first array is used to read current state metrics and the second array is used to write state metrics for the next stage; for the next stage, the functions are reversed. However, this approach is still problematic because it requires two full-size arrays, occupying valuable physical space inside the receiver. Thus, this prior art approach shares the same problems as the approach described above with regard to size, weight and expense.

Other prior art approaches have attempted to solve the problems associated with memory size by writing two metrics per location in order to reduce memory size by one-half. One problem with these types of approaches is that, because two values are stored in the same location, both values are read when only one value is needed. For a single port memory, only one value can be read at a time, and so one processor cycle is required to read the first value, and another processor cycle is needed for the second value. Additional control logic is required in order to determine which of the two values is needed and to isolate that value. A dual port memory can be used to increase the speed at which the two values are read; however, a problem still exists with regard to determining which value is needed and isolating that value. Thus, these approaches can require complicated control logic, additional data lines, and additional address logic. These approaches therefore also require additional processing power and battery power, and so also share the same problems as the approaches described above with regard to size, weight and expense.

Accordingly, what is needed is an apparatus that efficiently and quickly stores and retrieves state metrics in order to reduce memory size. What is also needed is an apparatus that addresses the above needs and minimizes the associated address logic. In addition, what is needed is an apparatus that addresses the above needs and minimizes consumption of space, processing power, and battery power in a receiver. The present invention provides a novel solution to the above needs.

These and other objects and advantages of the present invention will become obvious to those of ordinary skill in the art after having read the following detailed description of the preferred embodiments which are illustrated in the various drawing figures.

DISCLOSURE OF THE INVENTION

The present invention provides an apparatus and method thereof that efficiently and quickly store and retrieve state metrics in order to reduce memory size. The present invention also provides an apparatus and method thereof that minimize the associated address logic. In addition, the present invention provides an apparatus and method thereof that minimize consumption of space, processing power, and battery power in a receiver.

The present embodiment of the present invention pertains to an apparatus and method thereof for implementing a Viterbi decoder. In a preferred embodiment, the apparatus is disposed within a receiver used in a communication system, in particular a communication system that uses code division multiple access (CDMA) spread spectrum type communication signals.

In the present embodiment of the present invention, the apparatus includes a bus and a branch metric generator unit coupled to the bus. The branch metric generator unit generates metrics by measuring a difference between an encoded data bit and an expected data bit calculated using a convolutional code. A memory unit is also coupled to the bus. The memory unit includes a first register and a second register for storing the metrics. A parity bit is used to indicate a register for storing the metrics. In a first stage of the Viterbi decoder, a metric for a first state is stored at a first address in the first register and a metric for a second state is stored at a second address in the second register. The first state and the second state each branch to a third state and a fourth state in a trellis code of the Viterbi decoder.

In one embodiment, in a second stage of the Viterbi decoder, a metric for the third state is stored at the first address in the first register and a metric for the fourth state is stored at a second address in the second register. A parity bit is used to indicate a register for storing the metric for the third state and the metric for the fourth state.

In one embodiment, a N-bit counter is adapted to generate a sequence of N binary bits. The sequence of N binary bits is used to generate the first address and the second address in the memory unit. In this embodiment, the sequence of N binary bits is also used generate the parity value.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Figure 1:
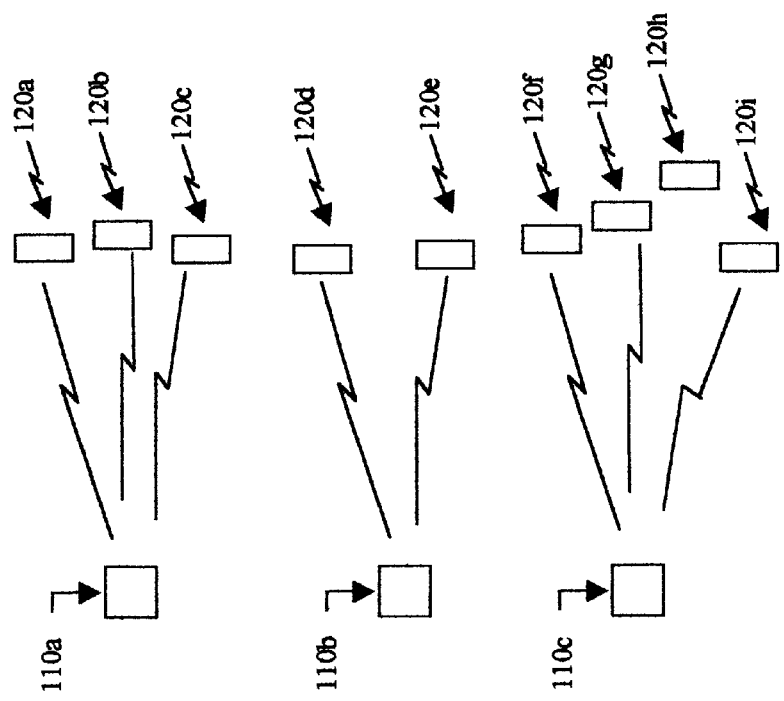
FIG. 1 provides a general overview of a wireless communication system in accordance with one embodiment of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, fragments, pixels, or the like.

As used herein, a transaction refers to the transmission or receipt of data or other such message information. The transaction may consist of all data associated with a particular computer system operation (e.g., a request or command). A transaction may also consist of a block of data associated with a particular operation; for example, a transfer of data may be broken down into several blocks of data, each block transferred prior to the transfer of a subsequent block, and each block making up a transaction.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "generating," "selecting," "measuring," "calculating," "inverting" or the like, refer to actions and processes of a computer system or similar electronic computing device. The computer system or similar electronic computing device manipulates and transforms data represented as physical (electronic) quantities within the computer system memories, registers or other such information storage, transmission or display devices. The present invention is well suited to the use of other computer systems.

The present invention is discussed in the context of a wireless communication system, in particular a system that uses code division multiple access (CDMA) spread spectrum type communication signals. In a preferred embodiment, the present invention is implemented in a receiver used in a wireless communication system. However, it is understood that other applications and implementations may be used in accordance with the present invention.

FIG. 1 provides a general overview of a wireless communication system 100 in accordance with one embodiment of the present invention. Communication system 100 consists of a family of base stations 110a, 110b and 110c (e.g., cells) that are geographically distributed over the service area. Communication system 100 also includes a plurality of subscriber stations (e.g., receivers 120a–120i). Communication system can be coupled to a standard telephone wire system (not shown). In the present embodiment, communication system 100 uses CDMA spread spectrum type communication signals, although it is appreciated that other applications using different communication technologies can be used in accordance with the present invention.

Each of receivers 120a–120i is exemplified as a mobile station such as a personal cordless telephone, a pager, or a computer system with a wireless modem; however, a subscriber station may also be in a relatively fixed location, such as a standard computer system with a wireless modem or the like.

Communication is established between a base station (e.g., base station 110a) and a subscriber station (e.g., receiver 120a) using well-known techniques. Once communication is established, movement of receiver 120a is detected and service is handed over from one base station to another.

Figure 2:
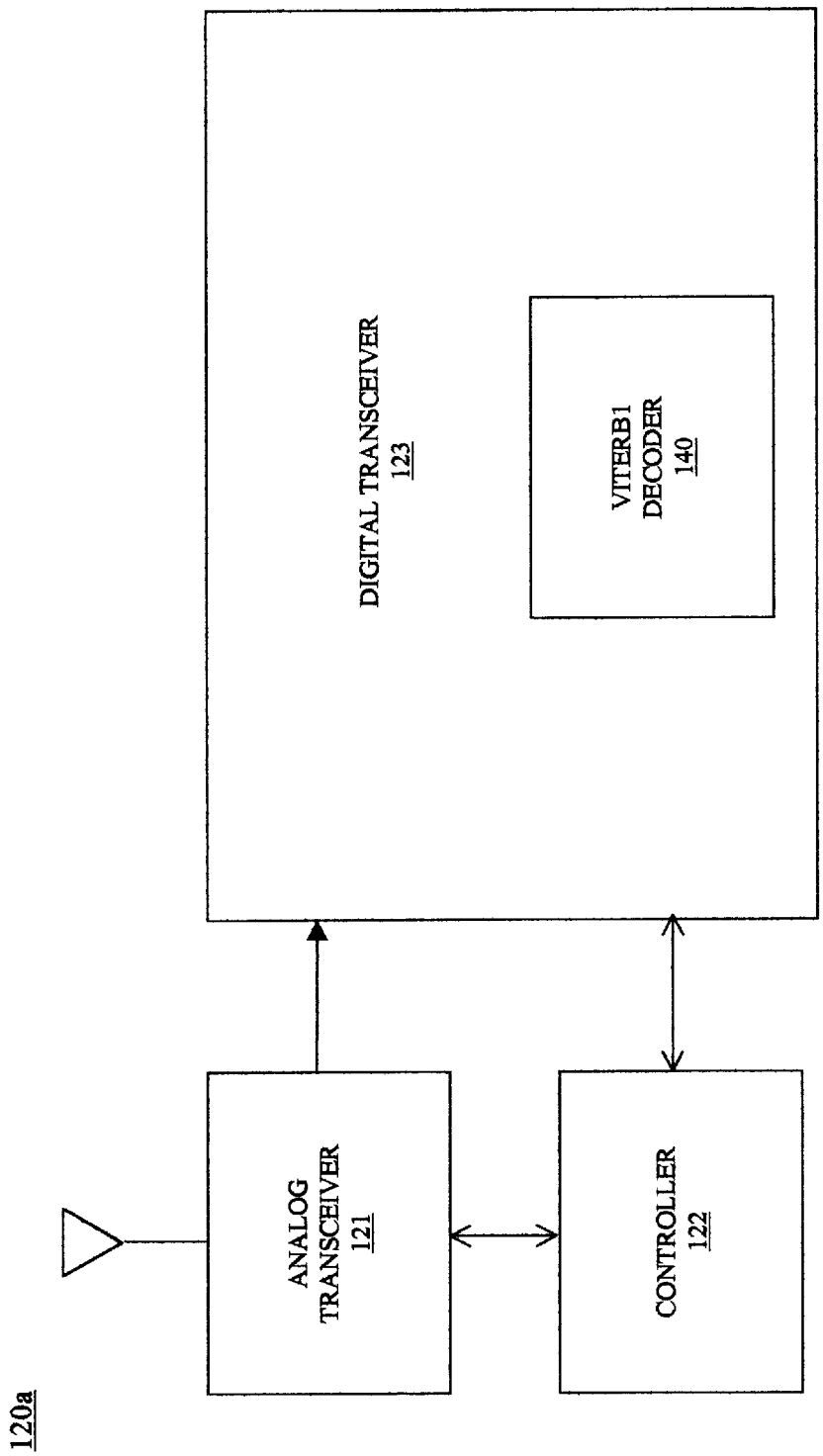
FIG. 2 illustrates the primary functional blocks in an exemplary subscriber station in a wireless communication system in accordance with one embodiment of the present invention.

FIG. 2 illustrates the primary functional blocks in a subscriber station such as that exemplified by receiver 120a in accordance with one embodiment of the present invention. Analog transceiver 121 is used, for example, to receive the communication signal from base station 110a (FIG. 1) and convert it from an analog signal (e.g., a radio signal) to a baseband digital signal. Controller 122 consists of, for example, the central processing unit and executes the control logic for receiver 120a. Digital transceiver 123 contains the digital data processing elements such as a demodulator and a modulator (not shown). Digital transceiver 123 also contains Viterbi decoder 140 including trellis code generator 130.

Figure 3:
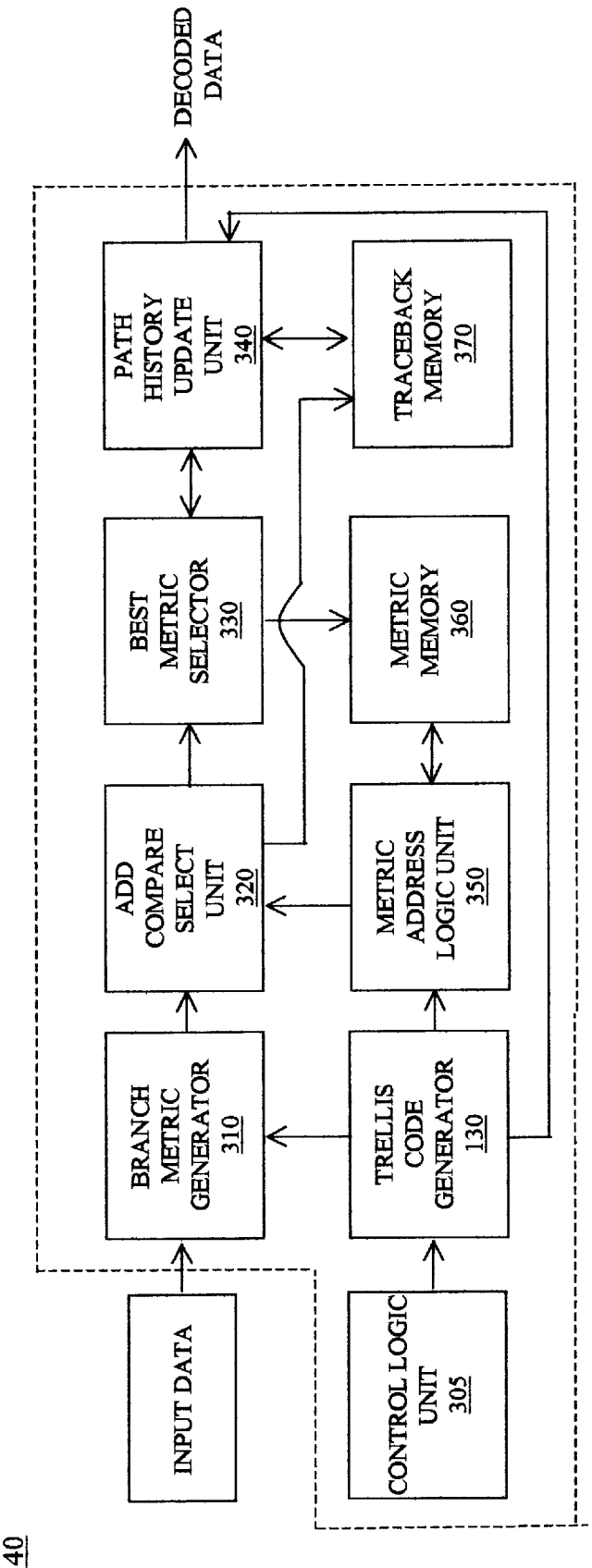
FIG. 3 is a block diagram of a Viterbi decoder in accordance with one embodiment of the present invention.

FIG. 3 is a block diagram of Viterbi decoder 140 in accordance with one embodiment of the present invention. Convolutional codes are known in the art and are used by a transmitter to encode a stream of binary digits. The encoded signals are received by the receiver (e.g., receiver 120a of FIG. 2) and the encoded data are input to Viterbi decoder 140. A convolutional code is often represented in a known fashion as a trellis that shows the encoded output for any possible sequence of input digits. For each frame, Viterbi decoder 140 determines the path through the convolutional code trellis that results in the sequence of digits that agrees most with the received signals.

Viterbi decoders, their function and implementation are well-known in the art. In the present embodiment, Viterbi decoder 140 comprises trellis code generator 130, Viterbi decoder control logic unit 305, branch metric generator 310, add compare select unit 320, best metric selector 330, path history update unit 340, metric address logic unit 350, metric memory 360, and traceback memory 370, coupled by buses.

Trellis code generator 130 computes expected values of the encoded data emulating the convolutional encoder used by the transmitter. Viterbi decoder 140 (specifically, branch metric generator 310) computes a metric (such as a Hamming distance or the like) for each branch that feeds into a node ("state") in the convolutional code trellis. The metrics are computed by comparing the received signal and the expected values from trellis code generator 130. The metric for each state is stored in metric memory 360. Metric address logic unit 350 is used to generate addresses in metric memory 360 for the metrics for each state. Traceback memory 370 contains information (e.g., survivor state information) required by Viterbi decoder 140 for a traceback operation. Traceback memory 370 contains a branch indicator indicating which of the two paths into a state was chosen for that state (e.g., the survivor state). In the traceback operation, Viterbi decoder 140 determines the path through the convolutional code trellis that results in the sequence of digits that agrees most with the received sequence. At the end of the traceback operation, the decoded data bit for each signal bit received by the receiver is produced.

Figure 4:
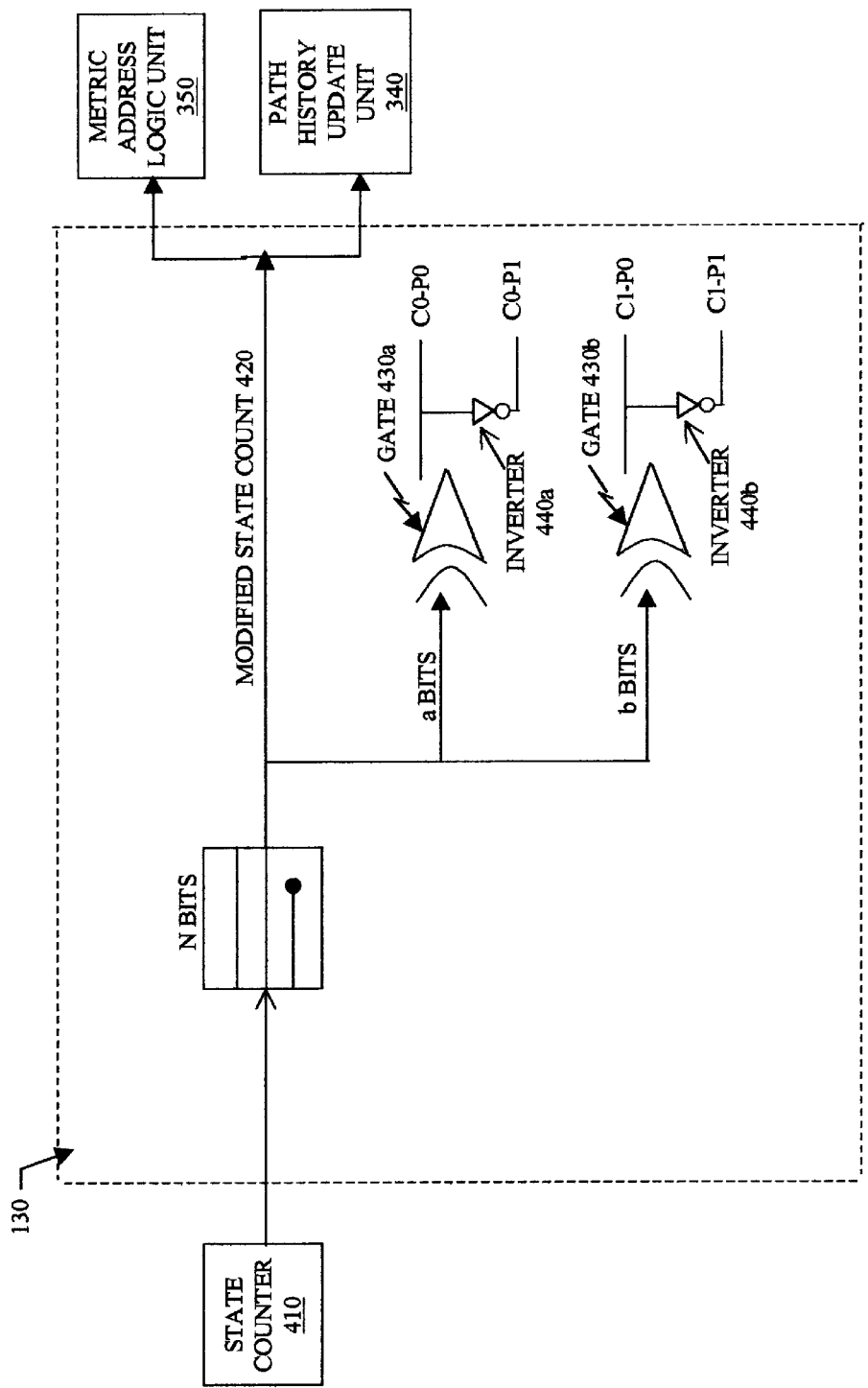
FIG. 4 illustrates the flow of data through a trellis code generator in accordance with one embodiment of the present invention.

FIG. 4 illustrates the flow of data through trellis code generator 130 in accordance with one embodiment of the present invention. Trellis code generator 130 computes the expected values that Viterbi decoder 140 (FIG. 3) compares to the received signal in order to generate branch metrics. Trellis code generator 130 is used to duplicate the convolutional code utilized by the transmitter.

Continuing with reference to FIG. 4, state counter 410 is a N-bit counter. In a preferred embodiment, N is eight (8) corresponding to a constraint length of nine (9); however, it is understood that greater or lesser number of stages and bits may be used in accordance with the present invention.

State counter 410 is implemented in Viterbi decoder control logic unit 305. State counter 410 counts through each of the possible states of N binary digits (e.g., initial state count). For each of the possible states in state counter 410, trellis code generator 130 calculates in real time the corresponding encoded values that would be calculated according to a convolutional code. That is, trellis code generator 130 duplicates the function of a convolutional encoder, and duplicates the output of a convolutional code for each given state as it is needed.

In one embodiment of the present invention, the N binary digits ("bits") produced by state counter 410 are manipulated to produce a modified state count 420. For example, a bit may be added to or removed from the N bits from state counter 410, or the bits may be rotated left or right by one or more positions. It Is appreciated that other forms of bit manipulation may be utilized in accordance with the present invention. The particular form of manipulation is implementation dependent.

Hence, modified state count 420 contains a sequence of bits that is a function of the states in state counter 410 (e.g., the initial state count). Modified state count 420 is subsequently used in metric address logic unit 350 and path history update unit 340, as explained below in conjunction with FIGS. 5 and 7, respectively. Thus, in accordance with the present invention, modified state count 420 is used for each of trellis code generator 130, metric address logic unit 350, and path history update unit 340.

With reference still to FIG. 4, modified state count 420 can be manipulated as described above (depending on the implementation), and then passed through gates 430a and 430b in order to calculate the corresponding encoded values that would be calculated according to a convolutional code. In the present embodiment, "a" bits are selected from modified state count 420 and passed through gate 430a, and "b" bits are selected from modified state count 420 and passed through gate 430b.

Gate 430a is an XOR gate known in the art, and is adapted to produce a single binary value depending on the combination of bits passed through the gate. The "a" bits are specifically selected so that the binary value produced by passing through gate 430a is the same as the encoded value that would be produced by a convolutional code. In this manner, trellis code generator 130 determines a first value C0-P0 of the convolutional code trellis.

In the present embodiment, the convolutional code utilized by the transmitter is symmetrical. For a symmetrical convolutional code, a second value C0-P1 of the convolutional code trellis can be determined by inverting the binary value produced by passing through gate 430a. Accordingly, inverter 440a is used to invert C0-P0 to determine C0-P1. For a convolutional code that is not symmetrical, modified state count 420 can be further manipulated and passed through another logical gate to determine C0-P1. That is, as above, modified state count 420 can be manipulated to form a sequence of bits that, when passed through a logical gate, produce a binary value that is the same as the encoded value that would be produced by a convolutional code.

In order to complete the convolutional code trellis for all states in state counter 410, further manipulation of modified state count 420 can be performed, and the resulting bits passed through a second logical gate to derive a second set of encoded values.

With reference still to FIG. 4, "b" bits are selected by further manipulation of modified state count 420 as described previously herein. The resulting combination of bits is passed through gate 430b. Gate 430b is an XOR gate known in the art, and is adapted to produce a single binary value depending on the combination of bits passed through the gate. The "b" bits are specifically selected so that the binary value produced by passing through gate 430b is the same as the encoded value that would be produced by a convolutional code. In this manner, trellis code generator 130 determines a third value C1-P0 of the convolutional code trellis.

In the present embodiment, the convolutional code utilized by the transmitter is symmetrical. For a symmetrical convolutional code, a fourth value C1-P1 of the convolutional code trellis is determined by inverting the binary value produced by passing through gate 430b. Accordingly, inverter 440b is used to invert C1-P0 to determine C1-P1.

For a convolutional code that is not symmetrical, the modified state count 420 can be further manipulated and passed through another logical gate to determine C1-P1. That is, as above, modified state count 420 can be manipulated to form a sequence of bits that, when passed through a logical gate, produce a binary value that is the same as the encoded value that would be produced by a convolutional code.

In the present embodiment, trellis code generator 130 is illustrated for a coding rate of ½. However, it is appreciated that trellis code generator 130 can be adapted for other coding rates (e.g., ⅓,¼) by, for example, adding gates and/or inverters.

An exemplary implementation in which N is four (4) is illustrated by Table 1. For N equal to 4, there are 16 possible states in state counter 410. In the present embodiment, bit 1 is removed from each state. Table 1 lists the 16 possible states in state counter 410 and the corresponding states in modified state count 420. As can be seen from Table 1, for each sequence of modified state count 420, there are two corresponding sequences of N bits in state counter 410. For example, both "0000" and "0010" correspond to "000."

TABLE 1

Exemplary State Register and State Counter Values for N = 4

| STATE COUNTER 410 VALUES | MODIFIED STATE COUNT 420 VALUES |
|---|---|
| 0000 | 000 |
| 0001 | 001 |
| 0010 | 000 |
| 0011 | 001 |
| 0100 | 010 |
| 0101 | 011 |
| 0110 | 010 |
| 0111 | 011 |
| 1000 | 100 |
| 1001 | 101 |
| 1010 | 100 |
| 1011 | 101 |
| 1100 | 110 |
| 1101 | 111 |
| 1110 | 110 |
| 1111 | 111 |

Figure 5:
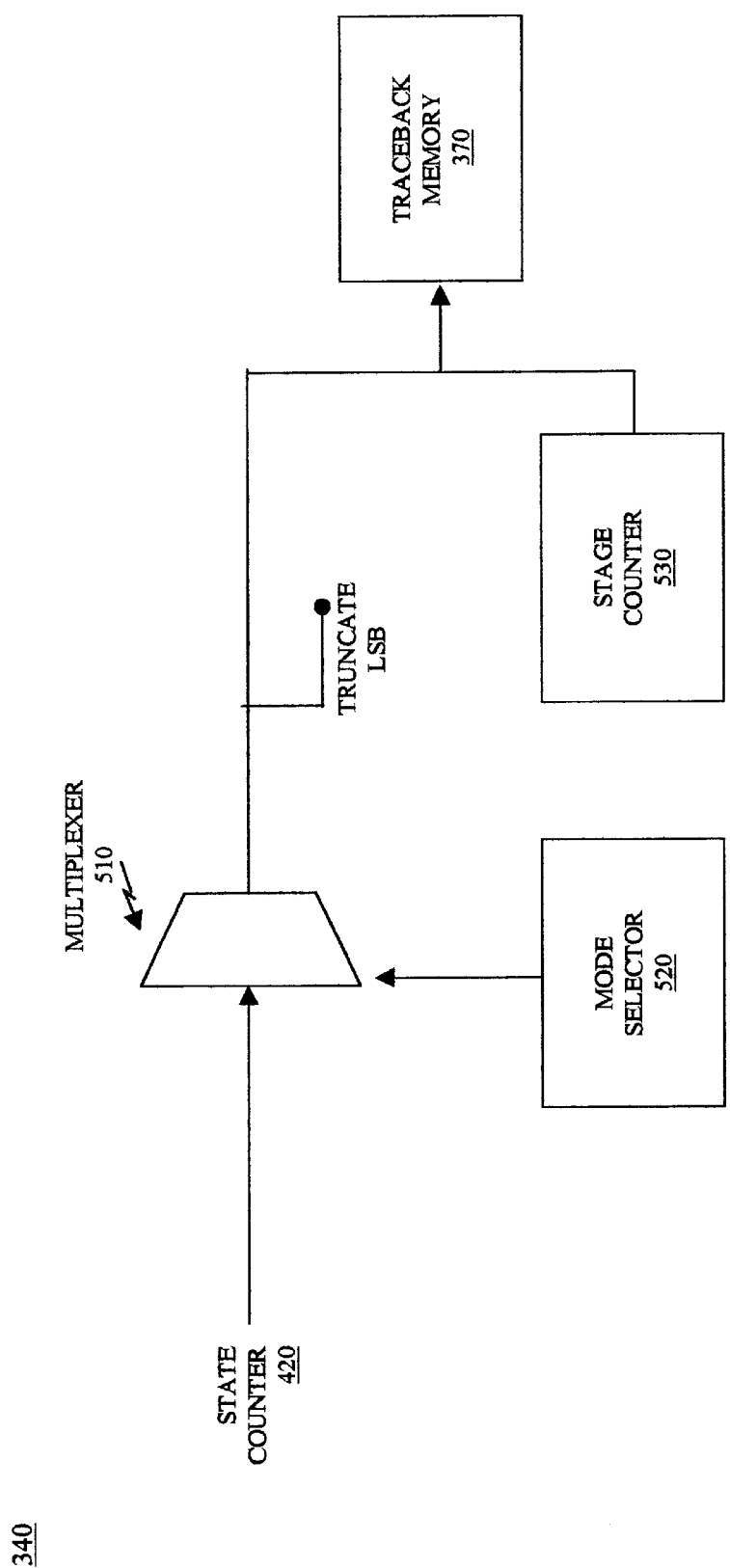
FIG. 5 illustrates the flow of data through a path history update unit in order to generate addresses for traceback memory in accordance with one embodiment of the present invention.

FIG. 5 illustrates the flow data through path history update unit 340 in order to generate addresses for traceback memory 370 in accordance with one embodiment of the present invention. Modified state count 420 is received as input from trellis code generator 130.

With reference to FIG. 5, in the present embodiment, read and write transactions are performed with traceback memory 370. Mode selector 520 is used to indicate the type of transaction (read or write) to multiplexer 510. The address generation operation is a write operation, and thus mode selector 520 indicates this to multiplexer 510.

Each pair of encoded data signal bits received is operated on by Viterbi decoder 140. Stage counter 530 is incremented accordingly to keep a running count of the stages.

In the present embodiment, the sequence of bits from modified state count 420 pass through multiplexer 510, and the least significant bit is truncated (removed). The bits from stage counter 530 are combined with the remaining bits that originated with modified state count 420 to form an address for traceback memory 370. In this manner, a unique address is generated for each stage and for each state. For each stage, a branch indicator indicating which of the two paths into a state was chosen for that state (e.g., the survivor state) is written to traceback memory 370 and placed in the appropriate location identified by the address generated for that stage and state. The information in traceback memory 370 is subsequently used by Viterbi decoder 140 in the traceback operation to determine the path through the convolutional code trellis that results in the sequence of digits that agrees most with the received sequence.

Figure 6:
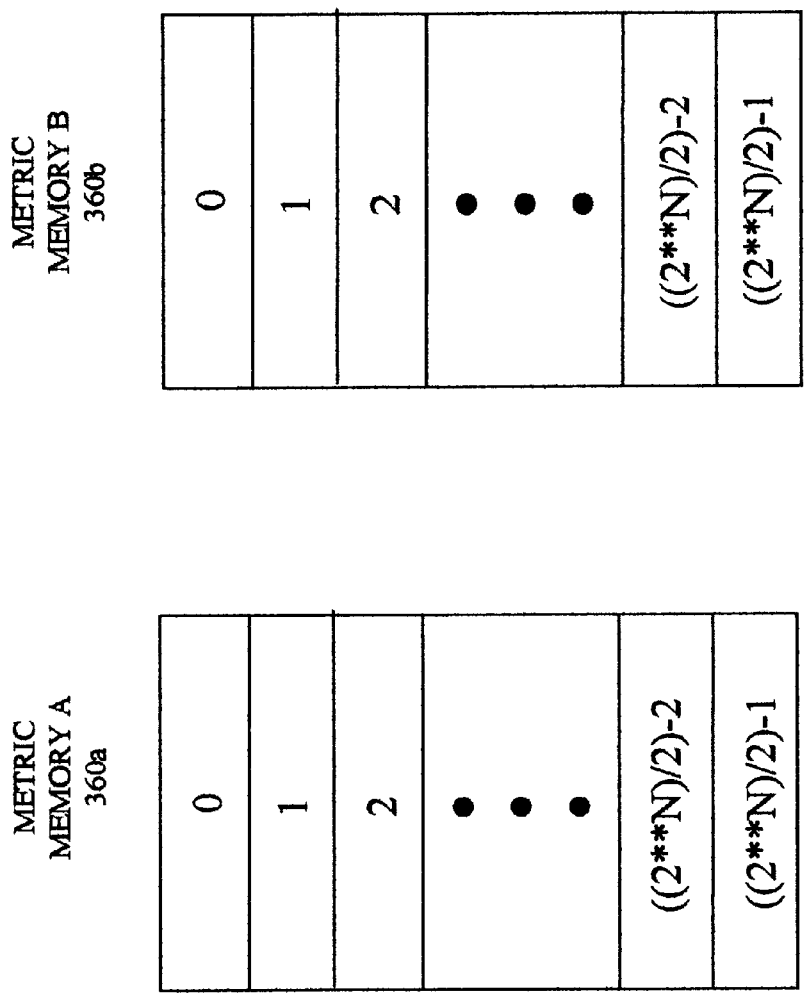
FIG. 6 illustrates the structure of a metric memory in accordance with one embodiment of the present invention.

FIG. 6 illustrates the structure of metric memory 360 (FIG. 3) in accordance with one embodiment of the present invention. Metric memory 360 is separated into two registers or arrays, metric memory A 360a and metric memory B 360b. In the present embodiment, metric memory A 360a and metric memory B 360b are single port memories. In the present embodiment, metric memory A 360a and metric memory B 360b each have the same number of locations. The total number of locations in metric memory A 360a and metric memory B 360b is equal to the number of possible states of N binary digits (e.g., $2^N$). Thus, metric memory A 360a and metric memory B 360b each contain $2^N/2$ locations.

As will be seen, metric memory A 360a and metric memory B 360b (collectively referred to as metric memory 360) are each used to both store state metrics for the originating states and to store the most recently calculated and accumulated metrics for all states. Accordingly, in accordance with the present invention, the size of the metric memory is reduced by one-half. In accordance with the present invention, an efficient addressing scheme is used to read from and write to metric memory A 360a and metric memory B 360b. The order in which the memory locations in metric memory A 360a and metric memory B 360b are accessed in accordance with the present invention is a crucial consideration in reducing the size of the metric memory. Advantageous use of the structure of the convolutional code trellis in accordance with the present invention accelerates processing of the data in metric memory 360, allows the memory size to be reduced, and simplifies the addressing logic.

Figure 7A:
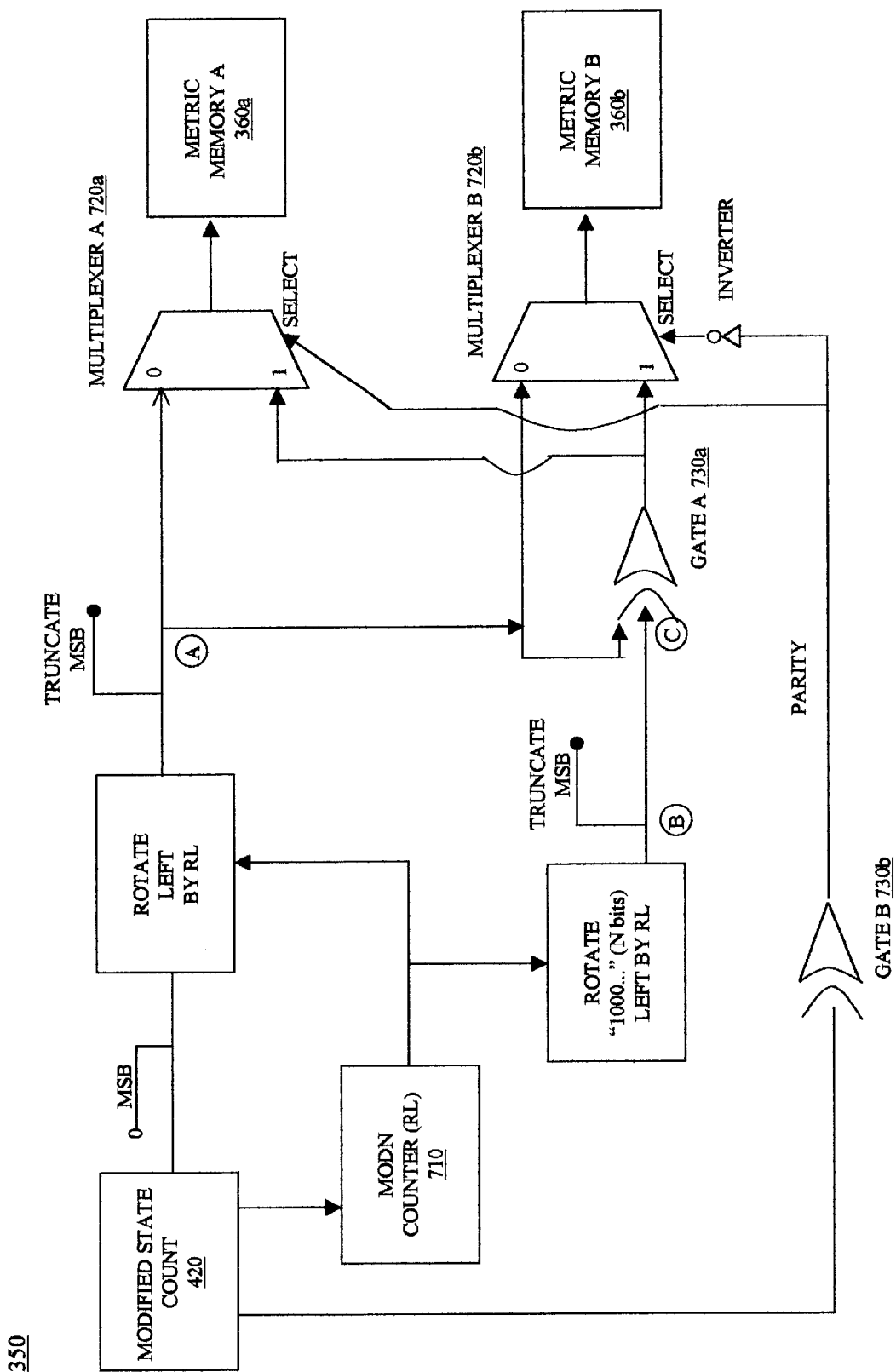
FIG. 7A illustrates the flow of data through a metric address logic unit in order to generate addresses for metric memory in accordance with one embodiment of the present invention.

FIG. 7A illustrates the flow of data through metric address logic unit 350 (FIG. 3) in order to generate addresses for metric memory 360a and metric memory 360b in accordance with one embodiment of the present invention. The addresses generated by metric address logic unit 350 are the addresses for each state in state counter 410 (FIG. 4).

Modified state count 420 is received as input from trellis code generator 130 (FIG. 4). As exemplified by Table 1, in the present embodiment each state in modified state count 420 corresponds to multiple states in state counter 410 (FIG. 4); whereas Table 1 illustrates the exemplary case of N equal to 4, it is appreciated that each modified state count corresponds to multiple states for different N. Accordingly, it is necessary to generate multiple addresses for each sequence from modified state count 420.

With reference still to FIG. 7A, in a first path (e.g., a bus) through metric address logic unit 350, a value of zero (0) is added to the most significant bit (MSB) location in modified state count 420, thus forming a new sequence of bits based on modified state count 420. This new sequence of bits is rotated left by a number of rotations RL specified by MODN counter 710. For example, if RL=0, the sequence of bits is not rotated; if RL=1, then the sequence of bits is rotated left once (that is, the most significant bit is placed into the least significant bit location, and the other bits are shifted left one place in the sequence). After the rotation occurs, the most significant bit is truncated (removed), and the remaining sequence of bits is forwarded to multiplexer A 720a and to multiplexer B 720b.

A second sequence of bits is also forwarded to multiplexer A 720a and multiplexer B 720b via a second path through metric address logic unit 350, as explained below. Based on a parity value of 0 or 1 that is also determined by metric address logic unit 350 (as explained below), one of the two sequences of bits at multiplexer A 720a is used to specify an address in metric memory A 360a. Similarly, one of the two sequences of bits at multiplexer B 720b is used to specify an address in metric memory B 360b based on the parity value.

In the second path through metric address logic unit 350, the second sequence of bits is determined by first rotating left an initial sequence of N bits by a number of rotations RL specified by MODN counter 710. The rotate left in the second path occurs at the same time as the rotate left in the first path above. The initial sequence of N bits is specified as "1000. . . ;" that is, a value of one (1) is placed in the most significant bit location, followed by N−1 zeros. Thus, for N=4, for example, the initial sequence of bits is "1000."

After the initial sequence of bits is rotated left by a number of rotations RL as described above, the most significant bit (MSB) is truncated and the resulting sequence of bits is forwarded to gate A 730a. Gate A 730a also receives the sequence of bits determined via the first path through metric address logic unit as described above. Gate A 730a is an XOR gate adapted to compare both sequences of N−1 bits and output a sequence of bits based on the comparison. The output from gate A 730a is forwarded to multiplexer A 720a and to multiplexer B 720b.

Thus, multiplexer A 720a receives two sequences of bits, one from the first path and one from the second path. Likewise, multiplexer B 720b also receives two sequences of bits, one from the first path and one from the second path.

Continuing with reference to FIG. 7A, at multiplexer A 720a and multiplexer B 720b, a parity value is used to select one of the two sequences of bits to specify an address in metric memory A 360a and to specify an address in metric memory B 360b. In accordance with the present invention, if the select signal value is zero at multiplexer A 720a, then the select signal value is one at multiplexer B 720b, and vice versa. Thus, the sequence of bits selected at multiplexer A 720a will be different than the sequence of bits selected at multiplexer B 720b.

The parity value is determined via a third path through metric address logic unit 350. Modified state count 420 is forwarded to gate B 730b. Gate B 730b is an XOR gate adapted to produce a single binary value based on the sequence of bits from modified state count 420. In the present embodiment, if the sequence of bits from modified state count 420 consists of an even number of ones, or if there are no ones in the sequence, then the parity is equal to zero (0); otherwise, the parity is set to one (1). The parity value determined by gate B 730b is used to select one of the two sequences of bits at multiplexer A 720a to generate an address in metric memory A 360a. The parity value is passed through an inverter, and the inverted value is used to select one of the two sequences of bits at multiplexer B 720b to generate an address in metric memory B 360b.

Figure 7B:
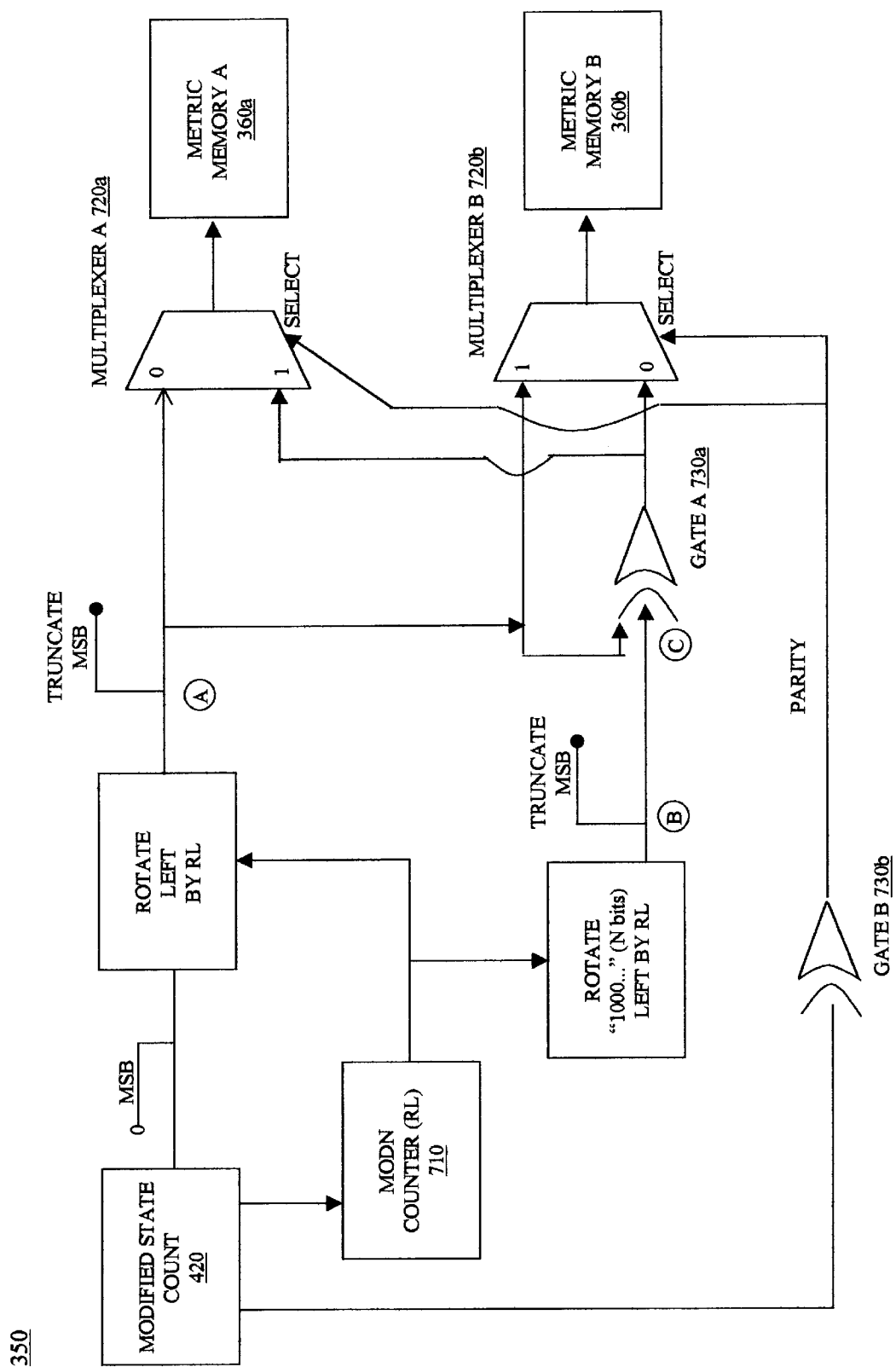
FIG. 7B illustrates an alternate embodiment of the metric address logic unit of FIG. 7A in accordance with present invention.

FIG. 7B illustrates an alternate embodiment of metric address logic unit 350 in accordance with present invention. In this embodiment, the two sequences of bits are received by multiplexer B 720b in inverse order relative to the embodiment illustrated in FIG. 7A. Accordingly, it is not necessary to pass the parity value through an inverter in the embodiment of FIG. 7B.

In accordance with the present embodiment of the present invention, the parity value is also used to read metric data from and write metric data to metric memory A 360a and B 360b. As described above, the addresses generated by metric address logic unit 350 are the addresses for each state in state counter 410 (FIG. 4). The metric data corresponding to each state is then read from these addresses and written to these addresses. The parity value is used to align the metric data with the corresponding state location in metric memory A 360a and B 360b.

With reference still to FIG. 7A, an exemplary implementation in accordance with one embodiment of the present invention of metric address logic 350 in which N is four (4) is illustrated by Table 2. For N equal to 4, there are 16 possible states in state counter 410. Not all values for the exemplary implementation are provided by Table 2; however, sufficient values provided to convey the use of metric address logic unit 350 in accordance with the present invention. In Table 2, "RL" corresponds to the output from MODN counter 710, "SC Rotate" corresponds to location A in FIG. 7A, "XOR Init" responds to location B in FIG. 7A, and "XOR Value" corresponds to location C in FIG. 7A.

Figure 8:
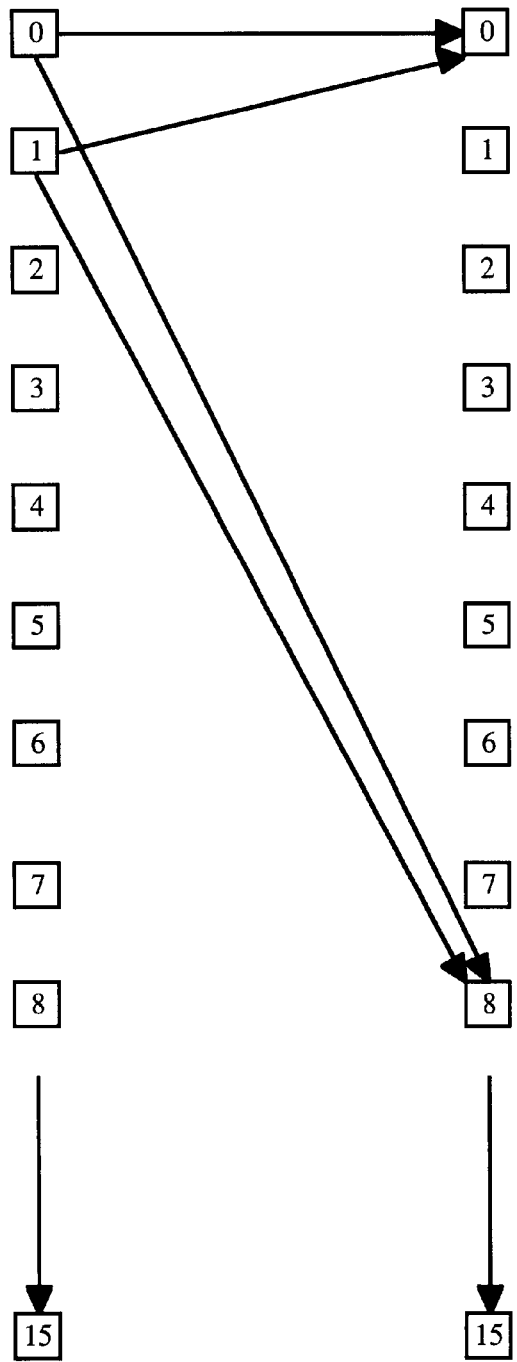
FIG. 8 is an illustration of an exemplary convolutional code trellis in accordance with one embodiment of the present invention.

FIG. 8 illustrates a portion of convolutional code trellis 850 utilized in accordance with one embodiment of the present invention. Convolutional code trellis 850 has a symmetrical structure. For example, state 0 (e.g., 0000 for N=4) in a first stage will generate states 0 (e.g., 0000, when the input bit is 0) and 8 (e.g., 1000, when the input bit is 1) in the next stage. Likewise, state 1 in a first stage will also generate states 0 and 8 in the next stage. In accordance with the present invention, states 0 and 1 are paired in the Viterbi decoder, as are states 2 and 3, 4 and 5, etc., to N−1 and N.

TABLE 2

Exemplary Implementation of Metric Address Logic Unit 350 (N = 4)

| RL | STATE REGISTER 420 (SC) | SC ROTATE | XOR INIT | XOR VALUE | PARITY | METRIC MEMORY A 360a ADDRESS | METRIC MEMORY B 360b ADDRESS |
|---|---|---|---|---|---|---|---|
| 0 | 000 | 000 | 1000 | 000 | 0 | 000 | 000 |
| 0 | 001 | 001 | 1000 | 000 | 1 | 001 | 001 |
| 0 | 010 | 010 | 1000 | 000 | 1 | 010 | 010 |
| 0 | etc. | etc. | etc. | etc. | etc. | etc. | etc. |
| 0 | 111 | 111 | 1000 | 000 | 1 | 111 | 111 |
| 1 | 000 | 000 | 0001 | 001 | 0 | 000 | 001 |
| 1 | 001 | 010 | 0001 | 001 | 1 | 011 | 010 |
| 1 | 010 | 100 | 0001 | 001 | 1 | 101 | 100 |
| 1 | etc. | etc. | etc. | etc. | etc. | etc. | etc. |
| 1 | 111 | 110 | 0001 | 001 | 1 | 111 | 110 |
| 2 | 000 | 000 | 0010 | 010 | 0 | 000 | 010 |
| 2 | 001 | 100 | 0010 | 010 | 1 | 110 | 100 |
| 2 | etc. | etc. | etc. | etc. | etc. | etc. | etc. |
| 2 | 111 | 101 | 0010 | 010 | 1 | 111 | 101 |
| 3 | 000 | 000 | 0100 | 100 | 0 | 000 | 100 |
| 3 | 001 | 000 | 0100 | 100 | 1 | 100 | 000 |
| 3 | etc. | etc. | etc. | etc. | etc. | etc. | etc. |
| 3 | 111 | 011 | 0100 | 100 | 1 | 111 | 011 |

Continuing with reference to FIG. 7A, an exemplary implementation of the contents of metric memory A 360a and metric memory B 360b in accordance with one embodiment of the present invention in which N is four (4) is illustrated by Table 3. For N equal to 4, there are 16 possible states in state counter 410. Accordingly, each of metric memory A 360a and metric memory B 360b hold metrics for eight (8) states each. The entries in Table 3 indicate the state number of the metric stored in the physical location listed; for example, an entry of "3" in Table 3 means that the metric for the third state (e.g., 0011) is stored in the location indicated for that stage. For N equal to 4, the state number as a function of physical location repeats after stage 3. (In Table 3, "MA" refers to metric memory A 360a and "MB" refers to metric memory B 360b. The address is written in decimal notation but implemented in binary.)

In accordance with the present invention, the two paired states are always in different memories, and thus are always available as a pair for every stage.

Table 3 demonstrates that the addressing logic in accordance with the present invention advantageously incorporates the symmetrical structure of the convolutional code trellis into the addresses generated by metric address logic unit 350 of FIG. 7A. For example, continuing with the example of state 0 and state 1 from the preceding paragraph, in stage 0 both state 0 and state 1 have an address of 000 (for N=4). In stage 1, state 0 has an address of 000 and state 1 has an address of 001; the addresses differ only by the least significant bit. In stage 2, state 0 has an address of 000 and state 1 has an address of 010; the addresses differ only by the middle bit. In stage 3, state 0 has an address of 000 and state 1 has an address of 100; the addresses differ only by the most significant bit.

TABLE 3

Exemplary Implementation of Metric Memory 360 (N = 4)

| ADDRESS | STAGE 0 MA | STAGE 0 MB | STAGE 1 MA | STAGE 1 MB | STAGE 2 MA | STAGE 2 MB | STAGE 3 MA | STAGE 3 MB | STAGE 4 MA | STAGE 4 MB |
|---|---|---|---|---|---|---|---|---|---|---|
| 0 | 0 | 1 | 0 | 8 | 0 | 4 | 0 | 2 | 0 | 1 |
| 1 | 3 | 2 | 9 | 1 | 12 | 8 | 6 | 4 | 3 | 2 |
| 2 | 5 | 4 | 10 | 2 | 5 | 1 | 10 | 8 | 5 | 4 |
| 3 | 6 | 7 | 3 | 11 | 9 | 13 | 12 | 14 | 6 | 7 |
| 4 | 9 | 8 | 12 | 4 | 6 | 2 | 3 | 1 | 9 | 8 |
| 5 | 10 | 11 | 5 | 13 | 10 | 14 | 5 | 7 | 10 | 11 |
| 6 | 12 | 13 | 6 | 14 | 3 | 7 | 9 | 11 | 12 | 13 |
| 7 | 15 | 14 | 15 | 7 | 15 | 11 | 15 | 13 | 15 | 14 |

Table 3 also demonstrates that the two state metrics needed in each pair are always available for every stage and state, one from metric memory A 360a and the other from metric memory B 360b. For example, in stage 0, states 0 and 1 are located in address 0 (decimal) of metric memory A 360a and metric memory B 360b, respectively. In stage 1, states 0 and 1 are located at different addresses (0 and 1, decimal) of metric memory A 360a and metric memory B 360b, respectively. Hence, there is never a situation when both required metrics in a pair are present in the same metric memory.

The relationships exemplified by Table 3 and implemented by metric address logic unit 350 in accordance with the present invention drive the order in which the states are generated from the originating states in subsequent stages of the Viterbi decoder process, and thus they drive the order in which the state metrics are accumulated and stored in metric memory A 360a and metric memory B 360b. As a result, metric memory A 360a and metric memory 360b in combination with the addressing logic implemented by metric address logic unit 350 can be used for storing state metrics for the originating states and for storing the most recently calculated and accumulated metrics for all states in a frame. In this manner, the size of the memory required to store state metrics for each state is reduced by one-half in accordance with the present embodiment of the present invention.

For example, using the values from Table 3, state 0 and 1 are paired as stated above, and the metrics corresponding to those states are read in stage 0. As described above, state 0 and state 1 both branch to states 0 and 8 in the convolutional code trellis. Thus, in stage 1, states 0 and 8 are written into the locations previously occupied by states 0 and 1 in stage 0. States 2 and 3 both branch to states 1 and 9, and so in stage 1 states 1 and 9 are written into the locations previously occupied by states 2 and 3 in stage 0. In this manner, the values in Table 3 are filled in for stage 1. Next, states 0 and 1 are read from stage 1. As before, these states branch to states 0 and 8, and so in stage 2 states 0 and 8 are written to the locations previously occupied by states 0 and 1 in stage 1. Similarly, states 2 and 3 are read from stage 1, branch to states 1 and 9, and in stage 2 states 1 and 9 are written to the locations previously occupied by states 2 and 3 in stage 1. This process is repeated for each paired set of states for each stage.

In accordance with the present embodiment of the present invention, when an address is specified for a read or write transaction, two metrics corresponding to two different states can be retrieved in parallel; metric memory A 360a and metric memory B 360b can thus each be single port memories. Accordingly, metric memory A 360a and metric memory B 360b can achieve the performance of a dual port memory without the complicated control logic and address logic. In accordance with the present invention, the two metrics are distinguished from each other by the parity value, as described above. In the present embodiment, for a read transaction or a write transaction, a multiplexer is used to apply the parity value to the metric so that it is properly associated with either metric memory A 360a and metric memory B 360b.

Thus, in accordance with the present embodiment of the present invention, metric address logic unit 350 generates addresses for metric memory A 360a and metric memory B 360b through bit manipulation in combination with gates and inverters. Gates and inverters are capable of creating the addresses quickly and efficiently, are cost-effective, and do not significantly consume valuable physical space, processing power, and battery power. In addition, the control logic and addressing logic are simplified.

Figure 9:
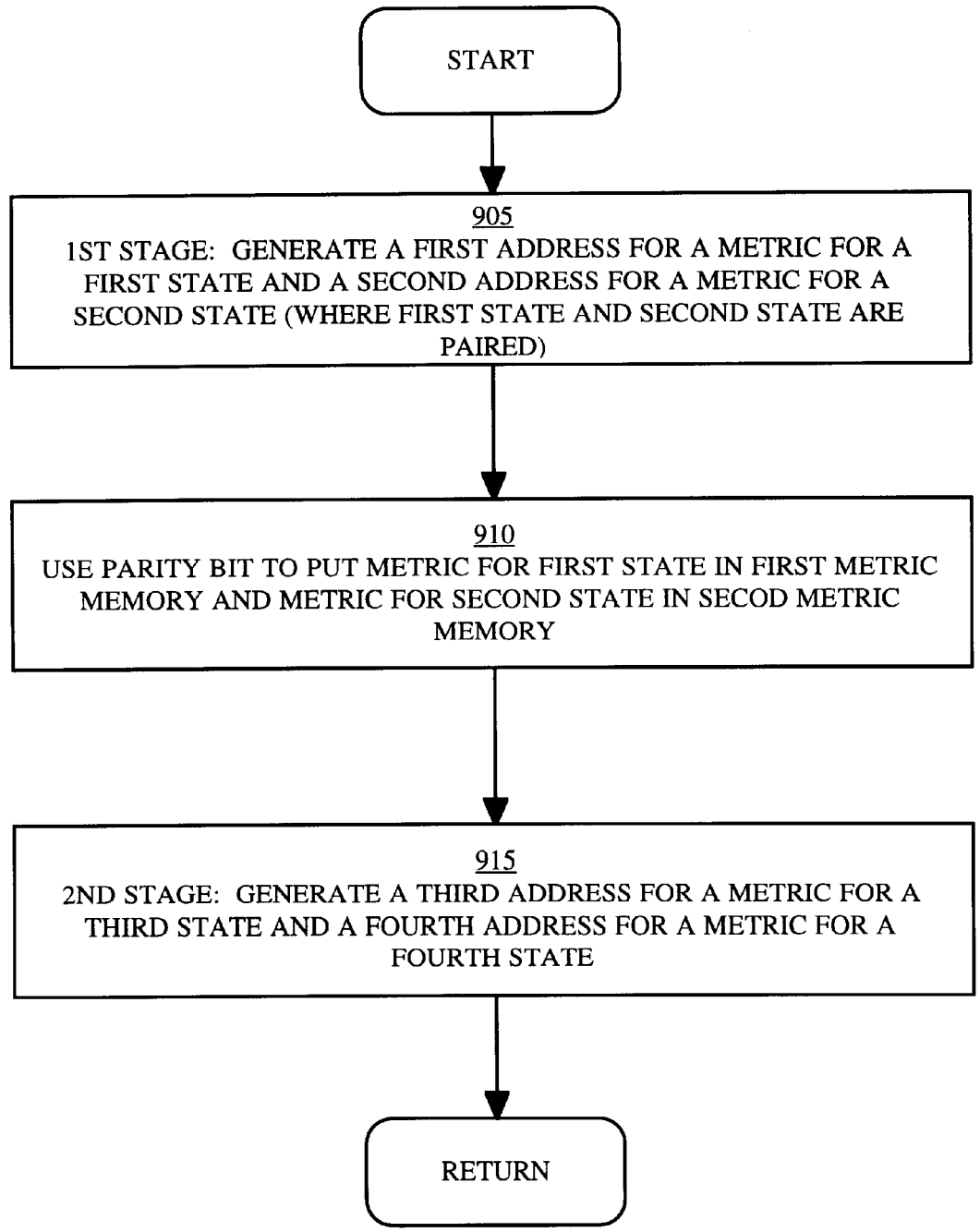
FIG. 9 is a flowchart of a process implemented by the Viterbi decoder to address and store metrics in accordance with one embodiment of the present invention.

FIG. 9 is a flowchart of process 900 implemented by Viterbi decoder 140 (FIG. 3) to store and address metrics in accordance with one embodiment of the present invention. Process 900 is repeated for each data frame received by a receiver (e.g., receiver 120a of FIG. 2).

In step 905 of FIG. 9, in the present embodiment, in a first stage of Viterbi decoder 140, metric address logic unit 350 (FIG. 7) generates a first address and a second address to store a metric for a first state and for a second state, respectively. In accordance with the present invention, states 0 and 1 are paired in the Viterbi decoder, as are states 2 and 3, 4 and 5, etc., to N–1 and N. These states are paired because, due to the symmetrical structure of the convolutional code, each of the paired states branches to the same states in the trellis; that is, for example, both states 0 and 1 branch to state 0 and 8 (decimal). In accordance with the present invention, the two paired states are always in different memories, and thus are always available as a pair for every stage.

In step 910, a parity bit is generated by metric address logic unit 350. The parity bit is used to identify which of metric memory A 360a or metric memory B 360b (FIG. 6) the metric for the first state and the metric for the second state are to be stored in (from step 905). In accordance with the present invention, as explained above, the parity bit is used to place the paired states in different memories so that they are available as a pair for every stage.

In step 915, in a second stage of Viterbi decoder 140, metric address logic unit generates a third and a fourth address to store a third and a fourth metric, respectively. The third and fourth metrics correspond to the third and fourth states, respectively. As described in conjunction with FIG. 3, the metrics for the third and fourth states are written in the second stage into the locations occupied by the first and second states in the preceding stage. A parity bit is used to indicate which of metric memory A 360a or metric memory B 360b the metrics for the third and fourth state are to be stored in.

Thus, metric memory A 360a and metric memory 360b in combination with the addressing logic implemented by metric address logic unit 350 can be used for storing state metrics for the originating states and for storing the most recently calculated and accumulated metrics for all states in a frame. In this manner, the size of the memory required to store state metrics for each state is reduced by one-half in accordance with the present embodiment of the present invention.

In summary, in accordance with the present embodiment of the present invention, metric memory A 360a and metric memory B 360b (FIG. 6) are each used to both store state metrics for the originating states and to store the most recently calculated and accumulated metrics for all states. Accordingly, the size of the metric memory is reduced by one-half. Metric address logic unit 350 (FIG. 7A) generates addresses for metric memory A 360a and metric memory B 360b through bit manipulation in combination with gates and inverters. Gates and inverters are capable of creating the addresses quickly and efficiently, are cost-effective, and do not significantly consume valuable physical space, processing power, and battery power. In addition, the control logic and addressing logic are simplified.

The present invention thus provides an apparatus and method thereof that efficiently and quickly store and retrieve state metrics in order to reduce memory size. The present invention also provides an apparatus and method thereof that minimize the associated address logic. In addition, the present invention provides an apparatus and method thereof that minimize consumption of space, processing power, and battery power in a receiver.

The preferred embodiment of the present invention, efficient metric memory configuration for a Viterbi decoder, is thus described. While the present invention has been described in particular embodiments, it should be appreciated that the present invention should not be construed as limited by such embodiments, but rather construed according to the following claims.

What is claimed is:

1. A method for storing and retrieving information in a Viterbi decoder, said method comprising the steps of:

a) in a first stage of said Viterbi decoder, generating a first address in a memory unit to store a metric for a first state, wherein said memory unit comprises a first register and a second register;

b) generating a second address in said memory unit to store a metric for a second state, wherein said first state and said second state each branch to a third state and a fourth state in a trellis code of said Viterbi decoder; and c) using a parity bit to indicate a register for storing said metric for said first state and said metric for said second state, such that said metric for said first state is stored in said first register and said metric for said second state is stored in said second register.

2. The method for storing and retrieving information in a Viterbi decoder as recited in claim 1 further comprising the steps of:

d) in a second stage of said Viterbi decoder, generating a third address in said memory unit to store a metric for said third state;

e) generating a fourth address in said memory unit to store a metric for said fourth state, wherein said third address and said fourth address duplicate said first address and said second address; and f) using a parity bit to indicate a register for storing said metric for said third state and said metric for said fourth state, such that said metric for said third state is stored in said first register and said metric for said fourth state is stored in said second register.

3. The method for storing and retrieving information in a Viterbi decoder as recited in claim 1 wherein said method is implemented in a receiver used in a communication system.

4. The method for storing and retrieving information in a Viterbi decoder as recited in claim 3 wherein said communication system uses code division multiple access (CDMA) spread spectrum type communication signals.

5. The method for storing and retrieving information in a Viterbi decoder as recited in claim 1 further comprising the steps of:

using a N-bit counter to generate a sequence of N binary bits;

using said sequence of N binary bits to generate said first address and said second address in said memory unit.

6. The method for storing and retrieving information in a Viterbi decoder as recited in claim 5 wherein said sequence of N binary bits is used to generate a parity value used to indicate a register for storing a metric in said memory unit.

7. The method for storing and retrieving information in a Viterbi decoder as recited in claim 6 wherein said parity value is implemented using a multiplexer.

8. An apparatus for storing and retrieving information in a Viterbi decoder, said apparatus comprising:

a bus;

a branch metric generator unit coupled to said bus, said branch metric generator unit for generating metrics by measuring a difference between an encoded data bit and an expected data bit calculated using a convolutional code; and a memory unit coupled to said bus, said memory unit comprising a first register and a second register for storing said metrics;

wherein a parity bit is used to indicate a register for storing said metrics, wherein in a first stage of said Viterbi decoder a metric for a first state is stored at a first address in said first register and a metric for a second state is stored at a second address in said second register, wherein said first state and said second state each branch to a third state and a fourth state in a trellis code of said Viterbi decoder.

9. The apparatus of claim 8 wherein said apparatus is implemented in a receiver used in a communication system.

10. The apparatus of claim 9 wherein said communication system uses code division multiple access (CDMA) spread spectrum type communication signals.

11. The apparatus of claim 8 wherein in a second stage of said Viterbi decoder a metric for said third state is stored at said first address in said first register and a metric for said fourth state is stored at a second address in said second register, wherein a parity bit is used to indicate a register for storing said metric for said third state and said metric for said fourth state.

12. The apparatus of claim 8 further comprising:

a N-bit counter adapted to generate a sequence of N binary bits, wherein said sequence of N binary bits is used to generate said first address and said second address in said memory unit.

13. The apparatus of claim 12 wherein said sequence of N binary bits is used generate said parity value.

14. The apparatus of claim 12 wherein said parity value is implemented using a multiplexer.

15. In a receiver used in a communication system, an apparatus for storing and retrieving information in a Viterbi decoder, said apparatus comprising:

a bus;

a branch metric generator unit coupled to said bus, said branch metric generator unit for generating metrics by measuring a difference between an encoded data bit and an expected data bit calculated using a convolutional code;

a memory unit coupled to said bus, said memory unit comprising a first register and a second register for storing said metrics;

wherein a parity bit is used to indicate a register for storing said metrics, wherein in a first stage of said Viterbi decoder a metric for a first state is stored at a first address in said first register and a metric for a second state is stored at a second address in said second register, wherein said first state and said second state each branch to a third state and a fourth state in a trellis code of said Viterbi decoder; and an address logic unit for generating addresses for locations in said first register and said second register.

16. The apparatus of claim 15 wherein said communication system uses code division multiple access (CDMA) spread spectrum type communication signals.

17. The apparatus of claim 15 wherein in a second stage of said Viterbi decoder a metric for said third state is stored at said first address in said first register and a metric for said fourth state is stored at a second address in said second register, wherein a parity bit is used to indicate a register for storing said metric for said third state and said metric for said fourth state.

18. The apparatus of claim 15 wherein said address logic unit further comprises:
 a N-bit counter adapted to generate a sequence of N binary bits, wherein said sequence of N binary bits is used to generate said first address and said second address in said memory unit.

19. The apparatus of claim 18 wherein said sequence of N binary bits is used generate said parity value.

20. The apparatus of claim 15 wherein said address logic unit further comprises a multiplexer.

* * * * *